(12) United States Patent
Usui

(10) Patent No.: US 10,056,196 B2
(45) Date of Patent: Aug. 21, 2018

(54) PHOTOELECTRIC CONVERSION ELEMENT MODULE

(75) Inventor: Hiroki Usui, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 12/913,468

(22) Filed: Oct. 27, 2010

(65) Prior Publication Data

US 2011/0088745 A1    Apr. 21, 2011

Related U.S. Application Data

(63) Continuation of application No. PCT/JP2009/001910, filed on Apr. 27, 2009.

(30) Foreign Application Priority Data

Apr. 28, 2008   (JP) .................................. 2008-116965
Feb. 24, 2009   (JP) .................................. 2009-040393

(51) Int. Cl.
*H01L 31/042*   (2014.01)
*H01G 9/20*   (2006.01)
*H01L 31/05*   (2014.01)

(52) U.S. Cl.
CPC ......... *H01G 9/2081* (2013.01); *H01L 31/042* (2013.01); *H01L 31/0508* (2013.01);
(Continued)

(58) Field of Classification Search
CPC .. H01G 9/2031; H01G 9/2081; H01L 31/042; H01L 31/0512; H01L 31/0508; Y02E 10/542
(Continued)

(56) References Cited

U.S. PATENT DOCUMENTS 4,243,432 A * 1/1981 Jordan ............. H01L 31/03365
136/244
5,863,354 A * 1/1999 Yoshida ....................... 136/251
(Continued)

FOREIGN PATENT DOCUMENTS

JP     2004-119305 A    4/2004
JP     2005-100875 A    4/2005
(Continued)

OTHER PUBLICATIONS

Korean Office Action dated Aug. 5, 2011, issued in corresponding Korean Patent Application No. 10-2010-7024144.
(Continued)

*Primary Examiner* — Tamir Ayad
(74) *Attorney, Agent, or Firm* — Sughrue Mion, PLLC

(57) ABSTRACT

A photoelectric conversion element module 200 includes a plurality of photoelectric conversion elements 100 and 100, each including a first electrode 10 and a second electrode 20 facing each other, and a conductive member 9 electrically connecting the photoelectric conversion elements 100 to each other. Each of the photoelectric conversion elements 100 is arranged in a planar shape so that a direction from each first electrode 10 to each second electrode 20 is the same. The conductive member 9 is connected to a surface of the first electrode 10 which is opposite to the second electrode 20 in at least one photoelectric conversion element 100 and is connected to a surface of the second electrode 20 which is facing the first electrode 10 in at least one different photoelectric conversion element 100, at a position at which the second electrode 20 does not overlap the first electrode 10.

7 Claims, 5 Drawing Sheets

(52) U.S. Cl.
CPC ....... *H01L 31/0512* (2013.01); *H01G 9/2031* (2013.01); *Y02E 10/542* (2013.01); *Y02E 10/549* (2013.01)

(58) Field of Classification Search
USPC ......................................................... 136/244
See application file for complete search history.

(56) References Cited

U.S. PATENT DOCUMENTS

| | | | |
|---|---|---|---|
| 6,069,313 A * | 5/2000 | Kay ............................... | 136/249 |
| 6,479,745 B2 * | 11/2002 | Yamanaka et al. ............ | 136/263 |
| 6,653,701 B1 * | 11/2003 | Yamazaki ............ | H01G 9/2031 |
| | | | 136/248 |
| 8,153,891 B2 * | 4/2012 | Yoshimine et al. ........... | 136/256 |
| 2004/0118444 A1 | 6/2004 | Duggal et al. | |
| 2005/0072458 A1 * | 4/2005 | Goldstein ............ | H01G 9/2031 |
| | | | 136/251 |
| 2005/0247340 A1 | 11/2005 | Zeira | |
| 2006/0162771 A1 * | 7/2006 | Inoue et al. ................... | 136/263 |
| 2006/0207645 A1 * | 9/2006 | Wada ............................ | 136/244 |
| 2007/0204906 A1 * | 9/2007 | Abe et al. ..................... | 136/263 |
| 2008/0020503 A1 * | 1/2008 | Sheats et al. .................. | 438/34 |
| 2008/0223428 A1 * | 9/2008 | Zeira ............................. | 136/244 |
| 2010/0012166 A1 | 1/2010 | Yamanaka et al. | |
| 2010/0071743 A1 | 3/2010 | Yamanaka et al. | |
| 2011/0126879 A1 | 6/2011 | Kitamura et al. | |

FOREIGN PATENT DOCUMENTS

| | | | | |
|---|---|---|---|---|
| JP | 2006-040555 A | 2/2006 | | |
| JP | 2007-220606 A | 8/2007 | | |
| JP | 2007-265635 A | 10/2007 | | |
| JP | 2007-305876 A | 11/2007 | | |
| KR | 10-2007-0072215 A | 7/2007 | | |
| WO | 96/29715 | 9/1996 | | |
| WO | 2007/083461 A1 | 7/2007 | | |
| WO | WO 2007/088751 A1 * | 8/2007 | ......... | H01L 31/0224 |
| WO | 2008/004553 A1 | 1/2008 | | |
| WO | 2009/144949 A1 | 12/2009 | | |

OTHER PUBLICATIONS

Chinese Office Action dated Nov. 15, 2012 in a Chinese Patent Application No. 200980114841.2.

* cited by examiner

PHOTOELECTRIC CONVERSION ELEMENT MODULE

CROSS REFERENCE TO RELATED APPLICATIONS

This application is a Continuation of National Stage of International Application No. PCT/JP2009/001910 filed Apr. 27, 2009, claiming priority based on Japanese Patent Application No. 2008-116965 filed Apr. 28, 2008 and Japanese Patent Application No. 2009-040393 filed Feb. 24, 2009, the contents of all of which are incorporated herein by reference in their entirety.

TECHNICAL FIELD

The present invention relates to a photoelectric conversion element module.

BACKGROUND ART

A dye-sensitized solar cell is developed by Gratzel, et al., (Swiss), has advantages of high photoelectric conversion efficiency and low manufacturing cost, and attracts attention as a new type solar cell.

The dye-sensitized solar cell has a structure in which a working electrode on which a porous oxide semiconductor layer having a photo-sensitized dye supported thereon and an counter electrode that is provided so as to face the working electrode are provided on a transparent base having a transparent semiconductor film provided thereon, in which an electrolyte containing redox pairs is filled between the working electrode and the counter electrode and surrounded by a sealing member.

In this type of dye-sensitized solar cell, when the photo-sensitized dye absorbs incident light, such as sun light or the like, electrons are generated and injected into oxide semiconductor fine particles, and electromotive force is generated between the working electrode and the counter electrode. In this way, the dye-sensitized solar cell serves as a photoelectric conversion element that converts light energy into power.

Patent Document 1 discloses a dye-sensitized solar cell module in which a plurality of the dye-sensitized solar cells is provided and the dye-sensitized solar cells are electrically connected to each other.

BACKGROUND ART DOCUMENT

Patent Document

Patent Document 1: Japanese Patent Application Laid-Open (JP-A) No. 2007-220606

DISCLOSURE OF INVENTION

Problems to be Solved by the Invention

In the dye-sensitized solar cell module disclosed in Patent Document 1, the working electrode and the counter electrode of each solar cell extend to the outside of an area surrounded by a sealing member. Each solar cell is arranged in a planar shape so that the surface of the extension portion of the working electrode of one solar cell that is facing the counter electrode is configured to face the surface of the extension portion of the counter electrode of another solar cell that is facing the working electrode, and the surfaces are connected to each other by a conductive adhesive serving as a conductive member.

In the dye-sensitized solar cell module disclosed in Patent Document 1, it is difficult to detach the working electrode from the counter electrode or re-connect the working electrode to the counter electrode once the working electrode of one solar cell is connected to the counter electrode of another solar cell by the conductive adhesive, since the conductive adhesive is disposed between the working electrode and the counter electrode to connect the working electrode and the counter electrode to each other. Therefore, a problem may arise in that there is a difficulty in doing maintenance of the dye-sensitized solar cell module, such as modification in the connection between the dye-sensitized solar cells or modification in the conductive member.

Accordingly, the present invention has been made to solve the above-mentioned problems, and an object of the invention is to provide a photoelectric conversion element module capable of enabling easy maintenance.

Means for Solving the Problem

A photoelectric conversion element module according to the present invention includes a plurality of photoelectric conversion elements, each including first and second electrodes facing each other, and a conductive member electrically connecting the photoelectric conversion elements to each other, wherein each of the photoelectric conversion elements are arranged in a planar shape so that a direction from each first electrode to each second electrode is the same, and wherein the conductive member is connected to a surface of the first electrode which is opposite to the second electrode in at least one photoelectric conversion element and is connected to a surface of the second electrode which is facing to the first electrode in at least one different photoelectric conversion element, at a position where the second electrode does not overlap the first electrode, when the second electrode is viewed in a direction perpendicular to the surface of the second electrode.

According to the photoelectric conversion element module, the photoelectric conversion elements are arranged in the planar shape so that the direction from each first electrode to each second electrode is the same. Therefore, the surface of the first electrode which is opposite to the second electrode in each photoelectric conversion element and the surface of the second electrode which is facing the first electrode face the same direction. The conductive member is connected to the surface of the first electrode which is opposite to the second electrode in at least one photoelectric conversion element, and is also connected to the surface of the second electrode which is facing the first electrode in at least one different photoelectric conversion element. Therefore, when the connection of the conductive member needs to be modified, the connection can be modified from the same direction. The conductive member is connected to the second electrode at the position at which the second electrode does not overlap the first electrode when the second electrode is viewed in the direction perpendicular to the surface of the second electrode on the surface of the second electrode which is facing the first electrode. Therefore, when the connection of the conductive member needs to be modified, work can be easily performed without hindrance by the first electrode. Accordingly, maintenance such as modification in the connection between the photoelectric conversion elements or replacement of the conductive member can be easily done.

In the photoelectric conversion element module, it is preferable that the conductive member connect a terminal formed on the first electrode to a terminal formed on the second electrode.

With such a configuration, the conductive member can be detached from the terminal on the second electrode when the connection between the photoelectric conversion elements needs to be modified or the conductive member needs to be replaced. Therefore, the damage to the second electrode can be suppressed as compared with the case in which the conductive member is directly connected to the second electrode.

In the above-described photoelectric conversion element module, the conductive member may be formed of a conductive wire.

In the above-described photoelectric conversion element module, the conductive member may be formed of a conductive adhesive.

In the photoelectric conversion element module, the conductive member may be formed of high-melting-point solder.

In the photoelectric conversion element module, it is preferable that a surface of the second electrode which is facing the conductive member in the photoelectric conversion element having the first electrode connected to the conductive member is covered with an insulating member.

In the photoelectric conversion element module, the insulating member can prevent short circuit between the second electrode and the conductive member, even when a conductive foreign matter or the like intrudes between the conductive member and the second electrode of the photoelectric conversion element in which the conductive member and the first electrode are connected to each other. Therefore, it is possible to prevent short circuit between the first and second electrodes through the conductive member in the photoelectric conversion element in which the conductive member and the first electrode are connected to each other. Moreover, it is possible to prevent short circuit between the second electrode of the photoelectric conversion element, in which the conductive member and the first electrode are connected to each other, and the second electrode of another photoelectric conversion element through the conductive member.

In the photoelectric conversion element module, it is preferable that the photoelectric conversion element is a photoelectric conversion element in which a porous oxide semiconductor layer, on which a dye-sensitizing agent is supported, and an electrolyte are sealed between the first and second electrodes by a sealing member, and the insulating member is formed with part of the sealing member.

In the photoelectric conversion element module, by a simpler configuration, it is possible to prevent short circuit between the photoelectric conversion elements.

Effects of the Invention

According to the present invention, there is provided a photoelectric conversion element module capable of easily performing maintenance.

BEST MODES FOR CARRYING OUT THE INVENTION

Hereinafter, photoelectric conversion element modules according to preferred embodiments of the invention will be described in detail with reference to the drawings.

First Embodiment

Figure 1:
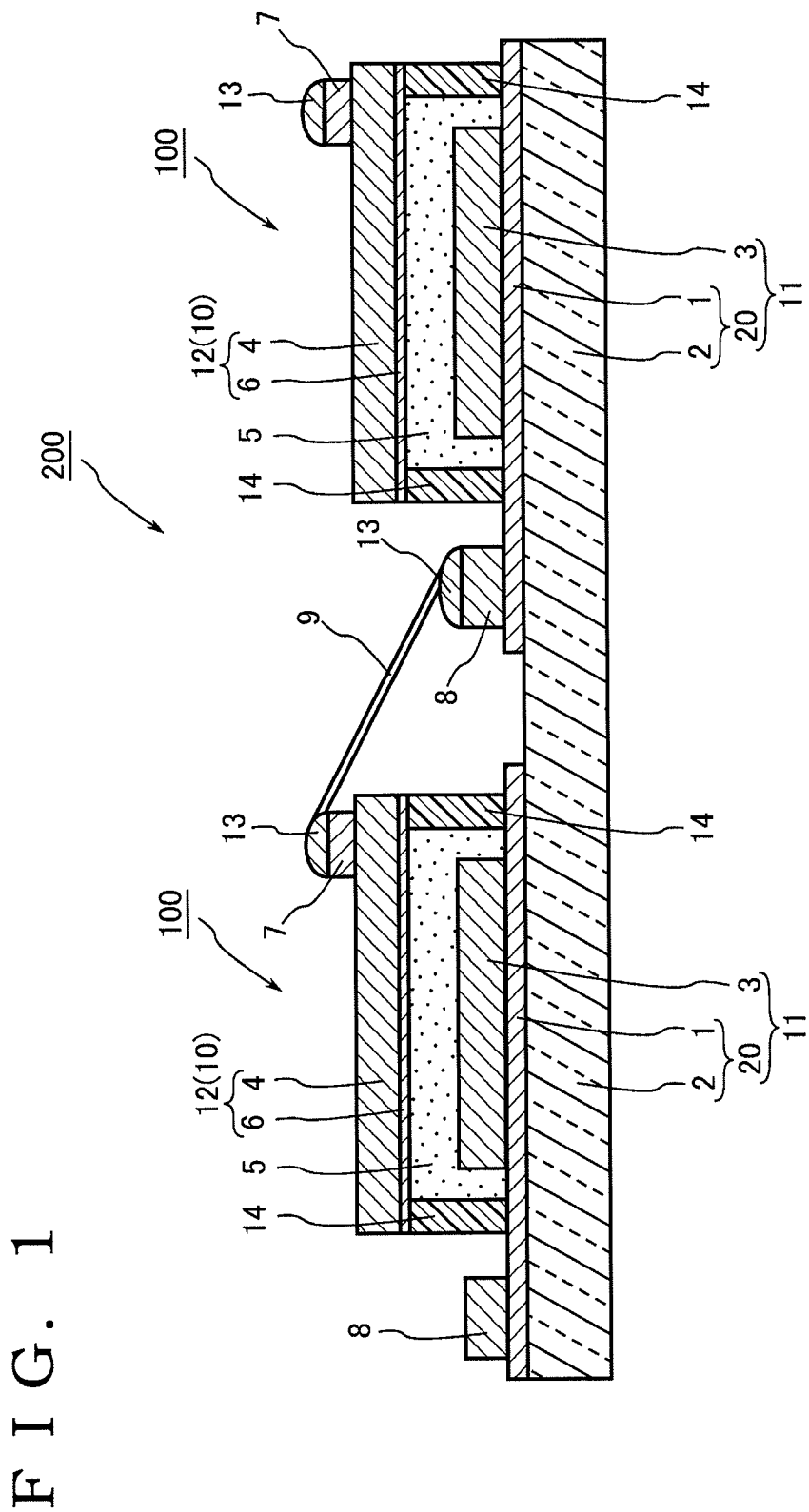
FIG. 1 is a sectional view illustrating a photoelectric conversion element module according to a first embodiment of the present invention.

FIG. 1 is a schematic sectional view illustrating a photoelectric conversion element module according to a first embodiment of the present invention.

As shown in FIG. 1, a photoelectric conversion element module 200 includes one pair of photoelectric conversion elements 100 and 100 and a conductive wire 9 serving as a conductive member for connecting the photoelectric conversion elements 100 and 100 to each other.

First, the photoelectric conversion elements 100 and 100 will be described. Since the photoelectric conversion elements 100 and 100 in the pair have the same configuration as each other, only one of the photoelectric conversion elements 100 will be described.

The photoelectric conversion element 100 includes a working electrode 11, an counter electrode 12 disposed to face the working electrode 11, an electrolyte 5 disposed between the working electrode 11 and the counter electrode 12, and a sealing member 14 surrounding the electrolyte 5.

(Working Electrode)

The working electrode 11 includes a second electrode 20 having a transparent base 2 and a transparent conductor 1 provided on one surface of the transparent base 2, and a porous oxide semiconductor layer 3 that is provided on the transparent conductor 1 and has a photo-sensitized dye supported thereon.

The transparent base 2 is formed of a substrate made of a translucent material. Examples of the translucent material include glass, polyethylene terephthalate (PET), polycarbonate (PC), polyether sulfone (PES), polyethylene naphthalate (PEN) and the like. The translucent material may be any material generally used to form the transparent base of the photoelectric conversion element. The material that forms the transparent base 2 is appropriately selected from the above materials considering, for example, electrolyte resistance. It is preferable that the transmittance of the transparent base 2 be as high as possible. It is more preferable that the transmittance of the transparent base be equal to or more than 90%.

The transparent conductor 1 is a transparent conductive thin film that is partially or wholly formed on one surface of the transparent base 2. In order to prevent the transparency of the working electrode 11 from being significantly damaged, it is preferable that the transparent conductor 1 be a thin film made of a conductive metal oxide. Examples of the conductive metal oxide include an indium tin oxide (ITO), a fluorine-added tin oxide (FTO), a tin oxide ($SnO_2$) and the like. The transparent conductor 1 may be a single layer or a laminate of a plurality of layers made of different conductive metal oxides. When the transparent conductor 1 is a single layer, it is preferable that the transparent conductor 1 be made of ITO or FTO in terms of ease of the formation of a film and a low manufacturing cost. It is more preferable that the transparent conductor 1 be made of FTO in terms of high heat resistance and high chemical resistance.

When the transparent conductor 1 is a laminate of a plurality of layers, it is possible to reflect the characteristics of each layer, which is preferable. It is preferable that the transparent conductor 1 be a laminated film of an ITO film and an FTO film. In this case, it is possible to achieve the transparent conductor 1 with high conductivity, high heat resistance, and high chemical resistance, and it is possible to form a transparent conductive substrate that absorbs a small amount of light in the visible range and has high conductivity. In addition, the thickness of the transparent conductor 1 may be in the range of, for example, 0.01 µm to 2 µm.

An oxide semiconductor forming the porous oxide semiconductor layer 3 is not particularly limited. Any material generally used to form the porous oxide semiconductor layer for a photoelectric conversion element may be used as the oxide semiconductor. Examples of the oxide semiconductor include a titanium oxide ($TiO_2$), a tin oxide ($SnO_2$), a tungsten oxide ($WO_3$), a zinc oxide (ZnO), a niobium oxide ($Nb_2O_5$), strontium titanate ($SrTiO_3$), an indium oxide ($In_2O_3$), a zirconium oxide ($ZrO_2$), a thallium oxide ($Ta_2O_5$), a lanthanum oxide ($La_2O_3$), an yttrium oxide ($Y_2O_3$), a holmium oxide ($Ho_2O_3$), a bismuth oxide ($Bi_2O_3$), a cerium oxide ($CeO_2$), and an aluminum oxide ($Al_2O_3$). The porous oxide semiconductor layer 3 may be made of an oxide semiconductor including two or more kinds of elements selected from them.

It is preferable that the average diameter of particles of the oxide semiconductor be in the range of 1 nm to 1000 nm. In this case, the surface area of the oxide semiconductor covered with dye increases, that is, photoelectric conversion is performed in the wide area. Therefore, it is possible to generate a large number of electrons. It is preferable that the porous oxide semiconductor layer 3 be formed by laminating oxide semiconductor particles with different particle size distributions. In this case, it is possible to repeatedly reflect light in the semiconductor layer and reduce the amount of incident light emitted to the outside of the porous oxide semiconductor layer 3. Therefore, it is possible to effectively convert light into electrons. The thickness of the porous oxide semiconductor layer 3 may be in the range of, for example, 0.5 µm to 50 µm. The porous oxide semiconductor layer 3 may be a laminate of a plurality of oxide semiconductors made of different materials.

As a method of forming the porous oxide semiconductor layer 3, there may be used a method including adding a desired additive to dispersion liquid that is obtained by dispersing, for example, commercial oxide semiconductor particles in a desired dispersion medium, or a colloid solution that can be prepared by a sol-gel method, according to need; applying a mixture by well-known coating such as screen printing, ink jet printing, roll coating, a doctor blade method, spray coating or the like; and making the mixture be porous by forming voids by heat processing or the like.

Examples of the photo-sensitized dye include ruthenium complexes including a bipyridine structure, a terpyridine structure or the like in a ligand, complexes including metal, such as porphyrin, phthalocyanine and the like, and organic dyes, such as eosin, rhodamine, merocyanine, and the like. It is possible to select a material suitable for the purpose or the semiconductor used from the above-mentioned materials without particular limitation. Specifically, for example, N3, N719, black dye or the like may be used.

(Electrolyte)

The electrolyte 5 may be formed by impregnating an electrolytic solution into the porous oxide semiconductor layer 3, or by impregnating an electrolytic solution into the porous oxide semiconductor layer 3, gelating the electrolytic solution using an appropriate gelation agent (pseudo-solidification), and integrating it with the porous oxide semiconductor layer 3. Alternatively, the electrolyte 5 may be a gel electrolyte including an ionic liquid, oxide semiconductor particles, or conductive particles.

As the electrolytic solution, the following solution is used in which an electrolyte component, such as iodine, iodide ions, tertiary-butyl pyridine or the like, is dissolved in an organic solvent, such as ethylene carbonate, acetonitrile or the like. As the gelation agent used to gelate the electrolytic solution, for example, polyvinylidene fluoride, polyethylene oxide derivative, amino acid derivative or the like may be used.

The ionic liquid is not particularly limited. Ambient temperature molten salt obtained by cationizing or anionizing a compound which includes quaternized nitrogen atoms and a liquid at a room temperature is given as an example of the ionic liquid. Examples of the cation of the ambient temperature molten salt include a quaternized imidazolium derivative, a quaternized pyridinium derivative, a quaternized ammonium derivative and the like. Examples of the anion of the ambient temperature molten salt include $BF_4^-$, $PF_6^-$, $F(HF)_n^-$, bis(trifluoro-methylsulfonyl)imide $[N(CF_3SO_2)_2^-]$, an iodide ion and the like. For example, salt including a quaternized imidazolium-based cation, an iodide ion, a bis(trifluoro-methylsulfonyl)imide ion or the like may be given as an example of the ionic liquid.

The kind of material forming the oxide semiconductor particle, the size of the oxide semiconductor particle or the like is not particularly limited. For example, a material that is easily mixed with an electrolytic solution including an ionic liquid as a main component and gelates the electrolytic solution is used to form the oxide semiconductor particles. In addition, the oxide semiconductor particle needs to have high chemical stability with respect to other coexisting components included in the electrolyte without reducing the conductivity of the electrolyte. In particular, it is preferable that the oxide semiconductor particle do not deteriorate due to an oxidation reaction even when the electrolyte includes a redox pair, such as iodine/iodide ion, bromine/bromide ion or the like.

It is preferable that the oxide semiconductor particle be made of one or a mixture of two or more kinds of materials selected from $TiO_2$, $SnO_2$, $WO_3$, ZnO, $Nb_2O_5$, $In_2O_3$, $ZrO_2$, $Ta_2O_5$, $La_2O_3$, $SrTiO_3$, $Y_2O_3$, $Ho_2O_3$, $Bi_2O_3$, $CeO_2$, and $Al_2O_3$. It is more preferable to use titanium dioxide fine particles (nano particles). It is preferable that the average diameter of the titanium dioxide fine particles be in the range of about 2 nm to 1000 nm.

Particles with conductivity, such as conductor particles, semiconductor particles or the like, are used as the conductive particles. The specific resistance of the conductive particle is preferably equal to or less than $1.0 \times 10^{-2}$ Ω·cm and more preferably equal to or less than $1.0 \times 10^{-3}$ Ω·cm. The kind, size or the like of the conductive particle is not particularly limited. For example, a material that is easily mixed with an electrolytic solution including an ionic liquid as a main component and gelates the electrolytic solution is used to form the conductive particles. In addition, the conductive particle needs to have high chemical stability with respect to other coexisting components included in the electrolyte without easily reducing its conductivity in the electrolyte. In particular, it is preferable that the conductive particle do not deteriorate due to an oxidation reaction even when the electrolyte includes a redox pair, such as iodine/iodide ion, bromine/bromide ion or the like.

For example, the conductive particles are made of a material having carbon as a main component. Specifically, examples of the conductive particle include a carbon nanotube particle, a carbon fiber particle, a carbon black particle and the like. A method of manufacturing these materials has been known, and materials on the market may be used as the above-mentioned materials.

(Counter Electrode)

The counter electrode 12 includes a first electrode 10. The first electrode includes a metal plate 4 made of titanium or a titanium alloy and a catalytic layer 6. The catalytic layer 6 accelerating a reduction reaction is formed on one surface of the metal plate 4 facing the working electrode 11. The catalytic layer 6 is made of platinum, carbon or the like.

(Sealing Material)

The sealing material 14 connects the working electrode 11 and the counter electrode 12, and the electrolyte 5 between the working electrode 11 and the counter electrode 12 is surrounded and sealed by the sealing material 14. For example, the sealing material 14 is made of an ionomer, an ethylene-vinyl acetate anhydride copolymer, an ethylene-methacrylate copolymer, an ethylene-vinyl alcohol copolymer, an ultraviolet-curable resin, or a vinyl alcohol polymer. In addition, the sealing material 14 may be made of only a resin, or a resin and an inorganic filler.

(Terminal)

The terminal 7 is formed on the surface of the counter electrode 12 opposite to the working electrode 11. The terminal 7 is high-melting-point solder or a metal member including at least one of copper and nickel.

It is preferable that solder with a melting point of 200° C. or more (for example, 210° C. or more) be used as the high-melting-point solder. Examples of the high-melting-point solder include Sn—Cu-based high-melting-point solder, Sn—Ag-based high-melting-point solder, Sn—Ag—Cu-based high-melting-point solder, Sn—Au-based high-melting-point solder, Sn—Sb-based high-melting-point solder, and Sn—Pb-based high-melting-point solder (the content of Pb is more than, for example, 85 wt %). One or two or more of them may be used as the high-melting-point solder.

For example, the metal member is made of a metal material including at least one of copper and nickel and other metal substances, in addition to a single element, such as copper or nickel.

In this embodiment, solder 13 for connecting, for example, a conductive wire and the terminal 7 is formed on the terminal 7. The solder 13 is not particularly limited, but when the terminal 7 is high-melting point solder, it is preferable that the solder 13 (hereinafter, solder 13 may be referred to as low-melting-point solder) have a melting point lower than that the high-melting point solder. It is preferable that solder having a melting point of, for example, lower than 200° C. be used as the low-melting-point solder. Examples of the low-melting-point solder include eutectic solder (for example, Sn—Pb) and lead-free solder (for example, Sn—Ag, Sn—Cu, Sn—Ag—Cu, Sn—Zn, or Sn—Zn—B).

When the low-melting-point solder is used, it is possible to prevent an increase in the temperature of the photo-sensitized dye supported on the porous oxide semiconductor layer 3 or the electrolyte 5 during connecting the conductive wire 9 and the terminal 7 by solder and thus prevent the deterioration of the photo-sensitized dye or the electrolyte 5.

A terminal 8 is formed on the transparent conductor 1 in a region outside the outer circumference of the sealing material 14 on the surface of the working electrode 11 facing the first electrode. In addition, the terminal 8 formed in one of the photoelectric conversion elements 100 is formed so as not to overlap the counter electrode 12, when viewing the working electrode 11 from the direction vertical to the surface of the working electrode 11 in the other photoelectric conversion element 100. The terminal 8 is made of a metal material, such as gold, silver, copper, platinum, or aluminum.

In this embodiment, the solder 13 for connecting, for example, a conductive wire and the terminal 8 is formed on the terminal 8. The solder 13 on the terminal 8 may be the same as the solder 13 on the terminal 7.

Next, the connection between the photoelectric conversion elements 100 will be described.

As shown in FIG. 1, in the photoelectric conversion element module 200, a pair of the photoelectric conversion elements 100 and 100 shares the transparent base 2. Therefore, the photoelectric conversion elements 100 and 100 are arranged such that the counter electrodes 12 and the working electrodes 11 are aligned in a planar shape so that a direction from the counter electrode 12 to the working electrode 11 is the same.

In the photoelectric conversion element module 200, one end of the conductive wire 9 is connected to the first terminal 7 on the counter electrode 12 of one of the photoelectric conversion elements 100 by the solder 13. The other end of the conductive wire 9 is connected to the terminal 8 that is formed on the working electrode 11 of the other photoelectric conversion element 100 so as not to overlap the counter electrode 12 of the one photoelectric conversion element 100 by the solder 13. In this way, a pair of the photoelectric conversion elements 100 and 100 is connected in series to each other.

The conductive wire 9 is a wire made of a conductive material, such as copper or solder. For example, a lead wire or a solder ribbon wire may be used as the conductive wire 9.

According to the photoelectric conversion element module 200 of this embodiment, the photoelectric conversion elements 100 and 100 are arranged in a planar shape so that a direction from the counter electrode 12 to the working electrode 11 is the same. Therefore, the surfaces of the counter electrodes 12 opposite to the working electrodes 11 and the surfaces of the working electrodes 11 facing the counter electrodes 12 in the photoelectric conversion elements 100 face the same direction. One end of the conductive wire 9 is connected to the first terminal 7 that is formed on the surface of the counter electrode 12 opposite to the working electrode 11 in one of the photoelectric conversion elements 100. The other end of the conductive wire 9 is connected to the terminal 8 that is formed on the surface of the working electrode 11 facing the counter electrode 12 in the other photoelectric conversion element 100. In this way, in the photoelectric conversion element module 200, one of the photoelectric conversion elements 100 and the other photoelectric conversion element 100 are connected to each other from the same direction by the conductive wire 9. Therefore, when the connection of the conductive wire 9 is changed, it is possible to change the connection of the conductive wire 9 from the same direction. The conductive wire 9 is connected to the working electrode 11 through the terminal that is formed on the surface of the working electrode 11 facing the counter electrode 12 so as not to overlap the counter electrode 12, when viewing the working electrode 11 from the direction vertical to the surface of the working electrode 11. Therefore, even when the connection of the conductive wire 9 is changed, the counter electrode 12 does not hinder the connection operation and thus it is possible to easily perform the operation. In this way, it is possible to easily perform a maintenance operation, such as an operation of changing the connection between the photoelectric conversion elements 100 and 100 or an operation of replacing the conductive wire 9.

In the photoelectric conversion element module 200, when the connection between the photoelectric conversion elements 100 and 100 is changed or the conductive member is replaced, it is possible to disconnect the conductive wire 9 from the terminal 8 of the working electrode 11. Therefore, it is possible to prevent the damage of the transparent conductor 1 of the working electrode 11, as compared to the case in which the conductive wire 9 is directly connected to the working electrode 11.

Next, a method of manufacturing the photoelectric conversion element module 200 shown in FIG. 1 will be described.

First, a pair of the photoelectric conversion elements 100 and 100 is prepared (photoelectric conversion element preparing step).

In the photoelectric conversion element module 200, a pair of the photoelectric conversion elements 100 and 100 shares the transparent base 2. Therefore, the photoelectric conversion elements 100 and 100 are manufactured at the same time. Hereinafter, only the manufacture of one photoelectric conversion element 100 will be described.

First, the working electrode 11 and the counter electrode 12 are prepared (preparing step).

The working electrode 11 may be obtained by the following process. First, the transparent conductor 1 is formed on one surface of the transparent base 2, thereby forming the second electrode 20. Then, the porous oxide semiconductor layer 3 is formed on the transparent conductor 1. Then, the photo-sensitized dye is supported on the porous oxide semiconductor layer 3.

The transparent conductor 1 is formed on the transparent base 2 by a thin film forming method, such as a sputtering method, a CVD (chemical vapor deposition) method, a spray pyrolysis deposition method (SPD method), or a vapor deposition method. Among them, the spray pyrolysis deposition method is preferable. When the transparent conductor 1 is formed by the spray pyrolysis deposition method, it is possible to easily control the Haze rate. In addition, the spray pyrolysis deposition method does not require a vacuum system. Therefore, when the spray pyrolysis deposition method is preferable since it is possible to simplify a manufacturing process and reduce costs.

A method of forming the porous oxide semiconductor layer 3 on the transparent conductor 1 mainly includes an applying process and a drying and burning process. The applying process includes, for example, applying the paste of $TiO_2$ colloid obtained by mixing $TiO_2$ powder, a surface active agent, and a thickening agent at a predetermined ratio to the surface of the hydrophilic transparent conductor 1 which is processed to have hydrophilicity. At that time, as an applying method, for example, the following method is used: a method of moving a pressing unit (for example, a glass rod) on the transparent conductor 1 such that the applied colloid has a uniform thickness while pressing the colloid against the transparent conductor 1. The drying and burning process includes, for example, a method in which the applied colloid is left in an ambient atmosphere at a room temperature for about 30 minutes so as to be dried, and is then burned at a temperature of 450° C. for about 60 minutes using an electric furnace.

In a method of supporting the photo-sensitized dye on the porous oxide semiconductor layer 3, first, a dye solution for supporting dye, for example, a solution obtained by adding a very small amount of N3 dye powder to a solvent including acetonitrile and t-butanol at a volume ratio of 1:1 is prepared.

Then, the second electrode 20 having the porous oxide semiconductor layer 3 formed thereon, which is subjected to a heat treatment at a temperature of about 120° C. to 150° C. in a separate electric furnace, is dipped in a solution including the photo-sensitized dye as a solvent in a schale-shaped container. Then, the second electrode 20 is maintained in a dark place for one day (about 20 hours). Then, the second electrode 20 having the porous oxide semiconductor layer 3 formed thereon is taken out from the solution including the photo-sensitized dye, and is cleaned with a mixed solution of acetonitrile and t-butanol. In this way, the working electrode 11 having the porous oxide semiconductor layer 3, which is a $TiO_2$ thin film having the photo-sensitized dye supported thereon, is obtained.

The terminal 8 formed on the second electrode 20 of the working electrode 11 is formed by, for example, applying silver paste using a printing method and heating and burning it. It is preferable that the terminal 8 be formed before a step of supporting the photo-sensitized dye on the porous oxide semiconductor layer 3.

On the other hand, in order to prepare the counter electrode 12, first, the metal plate 4 made of titanium or a titanium alloy is prepared. Then, the catalytic layer 6 made of, for example, platinum is formed on the surface of the prepared metal plate 4. The catalytic layer 6 is formed by, for example, a sputtering method. In this way, it is possible to obtain the first electrode 10 including the metal plate 4 and the catalytic layer 6. The first electrode 10 serves as the counter electrode 12.

Then, the electrolyte 5 is surrounded and sealed between the working electrode 11 and the counter electrode 12 by the sealing material 14 (sealing step).

In order to perform sealing, first, a resin or a precursor thereof for forming the sealing material 14 is formed on the working electrode 11. In this case, the resin or the precursor thereof is formed so as to surround the porous oxide semiconductor layer 3 of the working electrode 11. When the resin is a thermoplastic resin, a molten resin is applied onto the working electrode 11 and is then naturally cooled at the room temperature, or a film-shaped resin is made to contacts the working electrode 11, is heated and melted by an external heat source, and is naturally cooled at the room temperature, thereby obtaining the resin. For example, an ionomer or an ethylene-methacrylate copolymer is used as the thermoplastic resin. When the resin is an ultraviolet-curable resin, the ultraviolet-curable resin, which is the precursor of the resin, is applied onto the working electrode 11. When the resin is a water-soluble resin, an aqueous solution including the resin is applied onto the working electrode 11. For example, a vinyl alcohol polymer is used as the water-soluble resin.

Then, a resin or a precursor thereof for forming the sealing material 14 is formed on the counter electrode 12. The resin or the precursor thereof is formed on the counter electrode 12 at a position where it overlaps the resin or the precursor thereof formed on the working electrode 11 when the working electrode 11 faces the counter electrode 12. The resin or the precursor thereof may be formed on the counter electrode 12 by the same method as that forming the resin or the precursor thereof on the working electrode 11.

Then, an electrolyte is filled in the region surrounded by the resin or the precursor thereof on the working electrode 11.

Then, the working electrode 11 faces the counter electrode 12 to overlap the working electrode 11 with the resin on the counter electrode 12. Then, when the resin is a thermoplastic resin, the resin is heated and melted in a reduced-pressure environment to adhere the working electrode 11 and the counter electrode 12. In this way, the sealing material 14 is obtained. When the resin is an ultraviolet-curable resin, the working electrode 11 and the ultraviolet-curable resin on the counter electrode 12 are overlapped and the ultraviolet-curable resin is cured by ultraviolet rays, thereby forming the sealing material 14. When the resin is a water-soluble resin, a laminate is formed, is sufficiently dried at the room temperature so as not to stick to the finger, and is then dried in a low-humidity environment. In this way, the sealing material 14 is obtained.

Then, the terminal 7 is formed on the surface of the counter electrode 12 opposite to the working electrode 11, that is, on the surface of the first electrode 10 opposite to the second electrode 20 (terminal forming step).

When the terminal 7 is made of high-melting-point solder, the counter electrode 12, the high-melting-point solder, and the leading end of a soldering iron are arranged on the surface of the counter electrode 12 opposite to the working electrode 11 so as to come into contact with each other.

In this case, the leading end of the solder iron is heated to melt the high-melting-point solder and generates an ultrasonic wave. Thus, the high-melting-point solder is melted by heat transferred from the leading end of the solder iron and is vibrated by the ultrasonic wave generated from the leading end of the solder iron. Therefore, the wettability between the high-melting-point solder and the metal plate 4 is improved and the high-melting-point solder is fixed to the surface of the metal plate 4. In this way, the terminal 7 is formed on the surface of the counter electrode 12.

The temperature of the leading end of the solder iron is not particularly limited as long as the high-melting-point solder can be melted. However, it is preferable that the temperature of the leading end of the solder iron be in the range of, for example, 200° C. to 450° C. in order to sufficiently melt the solder. It is more preferable that the temperature of the leading end of the solder iron be in the range of 250° C. to 350° C. in order to prevent the oxidation of the solder and the deterioration of the photosensitized dye due to heat. It is preferable that the vibration frequency of the ultrasonic wave generated from the leading end of the solder iron be in the range of 10 kHz to 200 kHz. It is more preferable that the vibration frequency of the ultrasonic wave be in the range of 20 kHz to 100 kHz in order to prevent the damage of the metal plate 4.

Then, the solder iron is separated from the molten high-melting-point solder and the high-melting-point solder is cooled, thereby forming the terminal 7.

On the other hand, when the terminal 7 is a metal member including at least one of copper and nickel, first, the metal member is arranged on the surface of the counter electrode 12 opposite to the working electrode 11 and the metal member is pressed against the counter electrode 12. The pressing operation includes a case in which pressure is generated between the metal member and the counter electrode 12 due to the weight of the metal member. Ultrasonic vibration is applied to the metal member while the metal member is pressed. In this way, the counter electrode 12 and the metal member rub each other due to the ultrasonic vibration and at least a portion of an unnecessary oxide film is removed between the counter electrode 12 and the metal member. As a result, the counter electrode 12 and the metal member are bonded to each other in a solid phase state by plastic deformation due to pressure. In this way, the terminal 7 is bonded to the surface of the counter electrode 12.

In this case, it is preferable that the pressure between the counter electrode 12 and the metal member be more than 0 $N/m^2$ and equal to or less than 300 $N/m^2$ in terms of the close adhesion between the counter electrode 12 and the metal member. It is more preferable that the pressure be in the range of 1 $N·m^2$ to 100 $N·m^2$ in order to prevent the deformation of the counter electrode 12.

In addition, it is preferable that the ultrasonic wave applied to the metal member be applied in a parallel direction to the bonding surface between the counter electrode 12 and the metal member. It is preferable that the vibration frequency of the ultrasonic wave be in the range of 1 kHz to 200 kHz in terms of the good bonding between the counter electrode 12 and the metal member. It is more preferable that the vibration frequency be in the range of 10 kHz to 100 kHz in order to prevent the damage of the counter electrode 12. It is preferable that the vibration amplitude of the ultrasonic wave be in the range of 0.01 μm to 50 μm in terms of bonding, and it is more preferable that the vibration amplitude be in the range of 0.1 μm to 10 μm in order to prevent the damage of the metal member and the metal plate 4.

When the metal member is bonded, it is preferable to heat the metal member in order to further improve bonding strength. In this case, it is preferable that the temperature of the metal member be in the range of, for example, 10° C. to 500° C. in order to easily bond the counter electrode 12 and the metal member. It is more preferable that the temperature of the metal member be in the range of 20° C. to 200° C. in order to maintain the dye and the electrolytic solution in a good state.

The solder 13 on the terminal 7 and the terminal 8 is formed by melting solder on the terminals 7 and 8 and then solidifying the solder.

In this way, the photoelectric conversion element 100 shown in FIG. 1 is obtained.

Then, a pair of the photoelectric conversion elements 100 and 100 is connected to each other by the conductive wire 9 (connection step). In the connection between a pair of the photoelectric conversion elements 100 and 100, first, one end of the conductive wire 9 is connected to the terminal 7 on the counter electrode 12 of one of the photoelectric conversion elements 100 obtained in the above-mentioned way by the solder 13 on the terminal 7. The other end of the conductive wire 9 is connected to the terminal 8 on the working electrode 11 of the other photoelectric conversion element 100 by the solder 13 on the terminal 8.

In this way, it is possible to obtain the photoelectric conversion element module 200.

According to the method of manufacturing the photoelectric conversion element module 200 of this embodiment, the photoelectric conversion elements 100 and 100 are arranged in a planar shape so that a direction from the counter electrode 12 to the working electrode 11 is the same. Therefore, the surfaces of the counter electrodes 12 opposite to the working electrodes 11 and the surfaces of the working electrodes 11 facing the counter electrodes 12 in the photoelectric conversion elements 100 and 100 face the same direction. One end of the conductive wire 9 is connected to the first terminal 7 formed on the surface of the counter electrode 12 opposite to the working electrode 11 in one of the arranged photoelectric conversion elements 100 and 100. The other end of the conductive wire 9 is connected to the terminal 8 formed on the surface of the working electrode 11 facing the counter electrode 12 in the other photoelectric conversion element 100. In this way, in the photoelectric conversion element module 200, one of the photoelectric conversion elements 100 and the other photoelectric conversion element 100 are connected to each other from the same direction by the conductive wire 9. Therefore, in the manufacture of the photoelectric conversion element module 200, when the conductive wire 9 is connected, it is possible to perform its connection from the same direction. The conductive wire 9 is connected to the working electrode 11 through the terminal that is formed on the surface of the working electrode 11 facing the counter electrode 12 so as not to overlap the counter electrode 12, when viewing the working electrode 11 from the direction vertical to the surface of the working electrode 11. Therefore, even when the conductive wire 9 is connected, the counter electrode 12 does not hinder the connection operation and thus it is possible to easily perform the connection of the conductive wire 9. In this way, it is possible to easily the photoelectric conversion element module 200.

(Second Embodiment)

Figure 2:
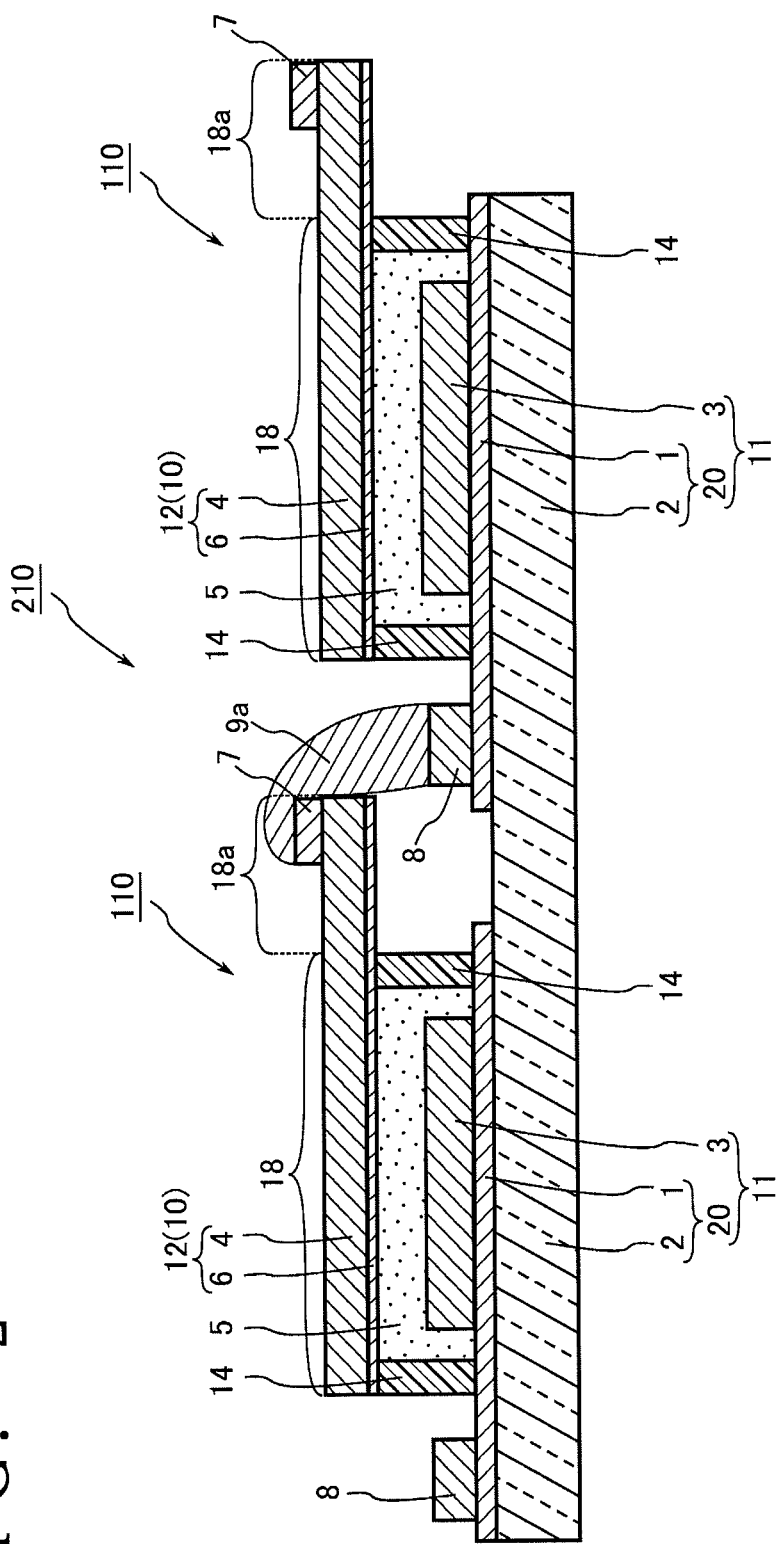
FIG. 2 is a sectional view illustrating a photoelectric conversion element module according to a second embodiment of the present invention.

Next, a second embodiment according to a photoelectric conversion device of the present invention will be described with reference to FIG. 2. In FIG. 2, the same components as those of the first embodiment or equivalents thereof are denoted by the same reference numerals and a description thereof will not be repeated.

FIG. 2 is schematic a cross-sectional view illustrating the photoelectric conversion device module according to this embodiment.

As shown in FIG. 2, a photoelectric conversion element module 210 includes a pair of photoelectric conversion elements 110 and 110 and a conductive adhesive 9a serving as a conductive member. The photoelectric conversion elements 110 and 110 share one transparent base 2.

In the photoelectric conversion element 110, the counter electrode 12 includes an extending portion 18a that extends from a region 18 surrounded by the outer circumference of the sealing material 14 to the outside, when viewing the counter electrode 12 from a direction vertical to the surface of the counter electrode 12. The photoelectric conversion element 110 is different from the photoelectric conversion element 100 according to the first embodiment in that the terminal 7 is formed on the extending portion 18a.

The photoelectric conversion element module 210 is different from the photoelectric conversion element module 200 according to the first embodiment in that the terminal 7 on the counter electrode 12 of one of the photoelectric conversion elements 110 and the terminal 8 on the working electrode 11 of the other photoelectric conversion element 100 are connected to each other by the conductive adhesive 9a.

Various kinds of metal paste, such as silver paste, or carbon paste, may be used as the conductive adhesive 9a.

According to the photoelectric conversion element module of this embodiment, the counter electrode 12 and the conductive adhesive 9a are connected to each other on the extending portion 18a. Therefore, even when heat is applied for connection, heat is hardly transferred to the inside of the region surrounded by the counter electrode 14. Therefore, it is possible to prevent the deterioration of the photo-sensitized dye supported on the porous oxide semiconductor layer 3 or the electrolyte 5 due to heat.

The photoelectric conversion element module 210 may be manufactured as follows.

First, a pair of the photoelectric conversion elements 110 and 110 is manufactured.

First, in the manufacture of a pair of the photoelectric conversion elements 110 and 110, in the preparing step according to the first embodiment, the counter electrode 12 having a region extending to the outside the region to be surrounded by the outer circumference of the sealing material 14 is prepared. That is, the counter electrode 12 having a region to be the extending portion 18a is prepared. The other processes in the preparing step are the same as those in the first embodiment.

In a sealing step, sealing is performed by the sealing material 14 such that the extending portion 18a is ensured. The sealing method may be the same as that in the sealing step according to the first embodiment.

Then, in a terminal forming step, the terminal 7 is formed on the extending portion 18a. The terminal may be formed by the same method as those in the terminal forming step according to the first embodiment.

Then, the terminal 7 on the counter electrode 12 of one of the photoelectric conversion elements 110 and the terminal 8 on the working electrode 11 of the other photoelectric conversion element 110 are connected to each other by the conductive wire 9 (connection step). Heat may be applied to connect the conductive adhesive 9a to the terminal 7 on the counter electrode 12 or the terminal 8 on the working electrode 11.

In this way, it is possible to obtain the photoelectric conversion element module 210.

(Third Embodiment)

Figure 3:
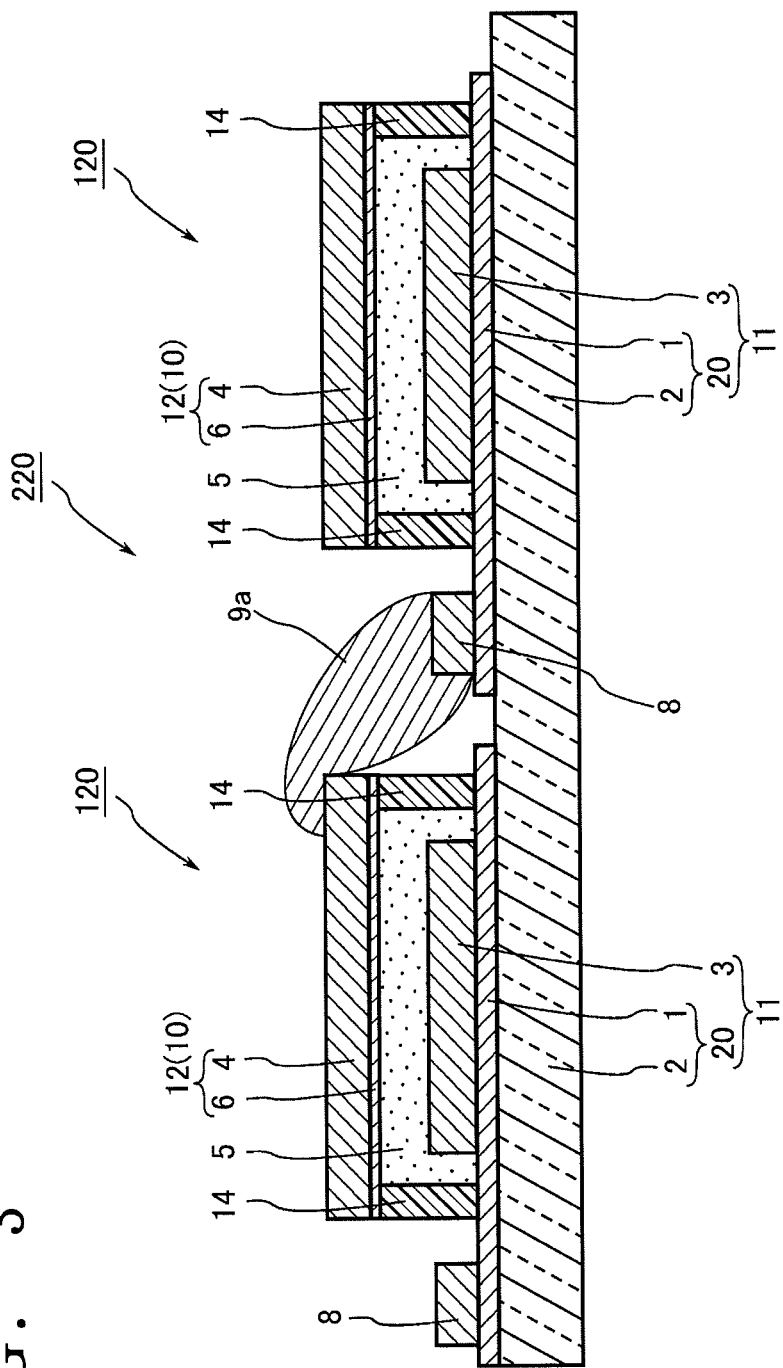
FIG. 3 is a sectional view illustrating a photoelectric conversion element module according to a third embodiment of the present invention.

Next, a third embodiment according to a photoelectric conversion device of the present invention will be described with reference to FIG. 3. In FIG. 3, the same components as those of the first embodiment or equivalents thereof are denoted by the same reference numerals and a description thereof will not be repeated.

FIG. 3 is a schematic cross-sectional view illustrating the photoelectric conversion device module according to this embodiment.

As shown in FIG. 3, a photoelectric conversion element module 220 includes a pair of photoelectric conversion elements 120 and 120 and a conductive adhesive 9a serving as a conductive member. The photoelectric conversion elements 120 and 120 share one transparent base 2.

In the photoelectric conversion element 120, the terminal 7 on the counter electrode 12 of the photoelectric conversion element 100 according to the first embodiment is not formed and the conductive adhesive 9a is directly connected to the surface of the counter electrode 12 opposite to the working electrode 11. The conductive adhesive 9a connects the counter electrode 12 and the terminal 8 on the working electrode 11.

Therefore, the metal plate 4 of the counter electrode 12 is made of a material with high adhesion to the conductive adhesive 9a. For example, the metal plate 4 is made of platinum or nickel.

According to the photoelectric conversion element module 220 of this embodiment, since the terminal 7 is not formed, it is possible to simplify the structure of the photoelectric conversion element module 220 and manufacture the photoelectric conversion element module 220 at a low cost.

The photoelectric conversion element module 220 may be manufactured as follows.

First, a pair of the photoelectric conversion elements 120 and 120 is prepared (photoelectric conversion element preparing step).

A pair of the photoelectric conversion elements 120 and 120 may be manufactured by the same method as that manufacturing a pair of the photoelectric conversion elements 100 and 100 according to the first embodiment except that the terminal 7 is not formed on the counter electrode 12.

Then, the surface of the counter electrode 12 opposite to the working electrode 11 in one of the photoelectric conversion elements 120 is connected to the terminal 8 on the working electrode 11 of the other photoelectric conversion element 120 by the conductive adhesive 9a (connection step).

In this way, it is possible to obtain the photoelectric conversion element module 220.

(Fourth Embodiment)

Figure 4:
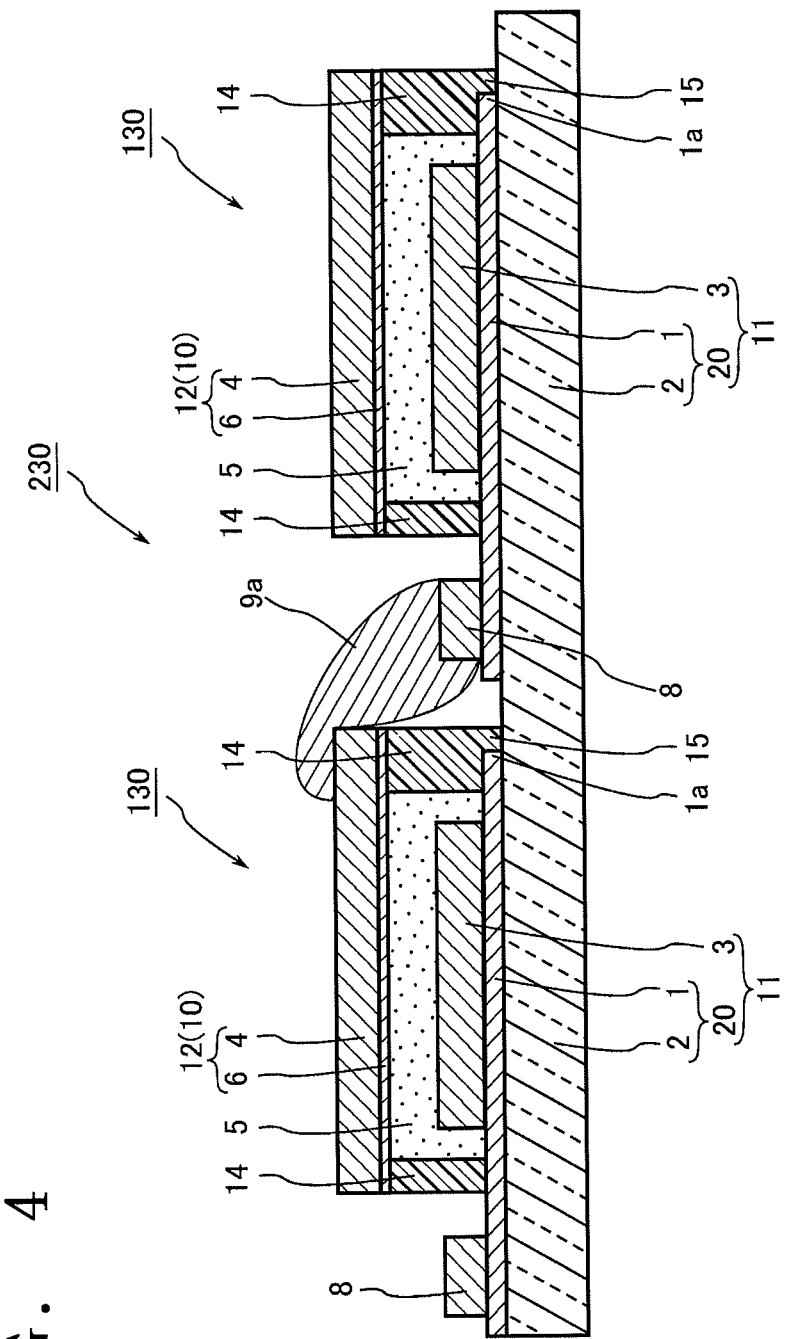
FIG. 4 is a sectional view illustrating a photoelectric conversion element module according to a fourth embodiment of the present invention.

Next, a fourth embodiment according to a photoelectric conversion device of the present invention will be described with reference to FIG. 4. In FIG. 4, the same components as those of the third embodiment or equivalents thereof are denoted by the same reference numerals and a description thereof will not be repeated.

FIG. 4 is a schematic cross-sectional view illustrating the photoelectric conversion device module according to this embodiment.

As shown in FIG. 4, a photoelectric conversion element module 230 includes a pair of photoelectric conversion elements 130 and 130 and a conductive adhesive 9a serving as a conductive member. The photoelectric conversion element 130 according to this embodiment is different from that according to the third embodiment in that the surface of the transparent conductor 1 facing the conductive adhesive 9a is covered with an insulating member 15, which is a portion of the sealing material 14, in the photoelectric conversion element 130 in which the conductive adhesive 9a and the counter electrode 12 are connected to each other. Specifically, in one of the photoelectric conversion elements 130, an end portion 1a of the transparent conductor 1 facing the other photoelectric conversion element 130 is covered with the insulating member 15, which is a portion of the sealing material 14.

According to the photoelectric conversion element module 230 of this embodiment, the insulating member 15 can prevent short circuit between the working electrode 11 and the conductive adhesive 9a, even when a conducive foreign matter or moisture intrudes between the working electrode 11 and the conductive adhesive 9a in the photoelectric conversion element 130 in which the conductive adhesive 9a and the counter electrode 12 are connected to each other. Therefore, it is possible to prevent short circuit between the counter electrode 12 and the working electrode 11 through the conductive adhesive 9a in the photoelectric conversion element 130 in which the conductive adhesive 9a and the counter electrode 12 are connected to each other. Moreover, it is possible to prevent short circuit between the working electrode 11 of the photoelectric conversion element 130, in which the conductive adhesive 9a and the counter electrode 12 are connected to each other, and the working electrode 11 of the other photoelectric conversion element 130 through the conductive adhesive 9a.

The photoelectric conversion element module 230 can be manufactured in the following way.

First, a pair of photoelectric conversion elements 130 and 130 is prepared (process of preparing the photoelectric conversion elements).

In the manufacturing of one pair of photoelectric conversion elements 130 and 130, the working electrodes 11 and the counter electrodes 12 may be prepared in the same way as those in the preparing process according to the third embodiment.

Next, in the sealing process, the sealing member is formed such that the sealing member covers the surface of the transparent conductor 1 of one photoelectric conversion element 130, in which the counter electrode 12 and the conductive adhesive 9a are scheduled to be connected to each other, facing the other photoelectric conversion element 130. The other sealing processes may be performed in the same way as those in the sealing processes according to the first embodiment.

Next, the surface of the counter electrode 12 of one photoelectric conversion element 130 which is on the opposite side of the working electrode 11 and the terminal 8 on the working electrode 11 of the other photoelectric conversion element 130 are connected to each other by the conductive adhesive 9a (connecting process).

In this way, the photoelectric conversion element module 230 can be obtained.

Although the first to fourth embodiments of the present invention have hitherto been described, the present invention is not limited thereto.

For example, the terminal forming process is performed after the sealing process in each of the first and second embodiments, but the present invention is not limited thereto. For example, the terminal forming process may be performed before the sealing process.

In this case, the terminal 7 is formed on one surface of the counter electrode 12 before the sealing is performed. The terminal may be formed in the same way as that of the terminal forming process in the first embodiment.

Next, since the terminal 7 is not sealed by the sealing member, the sealing may be performed by allowing the working electrode 11 and the counter electrode 12 face to each other so that the surface of the counter electrode 12 on which the terminal 7 is not formed faces the working electrode 11 side. The sealing method may be performed in the same way as that of the sealing process according to the first embodiment.

When the terminal forming process is thus performed before the sealing process, it is possible to prevent the dye-sensitizing agent or the electrolyte 5 from deteriorating due to the heat transferred to the dye-sensitizing agent or the electrolyte 5 in the terminal forming process even when the heat is applied in the terminal forming process since the porous oxide semiconductor layer 3 and the electrolyte 5 are not sealed.

In the third embodiment, the metal plate 4 of the counter electrode 12 is made of platinum, nickel, or the like and the conductive member is formed of the conductive adhesive 9a, but the present invention is not limited thereto. For example, the metal plate 4 of the counter electrode 12 may be made of titanium or titanium alloy, as in the first embodiment, and the conductive member may be formed of high-melting solder.

When metal plate 4 and the conductive member are configured as described above, since the terminal 7 is not formed, it is possible to simplify the structure of the photoelectric conversion element module and manufacture the photoelectric conversion element module at a low cost.

The photoelectric conversion element module may be manufactured in the following way.

First, one pair of photoelectric conversion elements are prepared (process of preparing the photoelectric conversion elements).

One pair of photoelectric conversion elements may be manufactured in the same way as the pair of photoelectric conversion elements 100 and 100 according to the first embodiment, except that the terminal 7 is not formed on the counter electrode 12.

Next, the surface of the counter electrode which is on the opposite side of the working electrode in one photoelectric conversion element and the terminal on the working electrode of the other photoelectric conversion element are connected through the high-melting solder (connecting process).

In a connection method using the high-melting solder, first, the high-melting solder, the metal plate of the counter electrode of one photoelectric conversion element, and the terminal on the working electrode of the other photoelectric conversion element are brought into contact with each other, and the high-melting-point solder and the leading end of solder iron are arranged to come into contact with each other. Then, the high-melting-point solder is connected by the application of ultraviolet waves while the high-melting-point solder is heated and melted in the same way as the way of connecting the high-melting solder on the counter electrode 12 in the first embodiment.

In this way, the photoelectric conversion element module is obtained in which the metal plate of the counter electrode is made of titanium or titanium alloy and the conductive member is formed of the high-melting-point solder.

Figure 5:
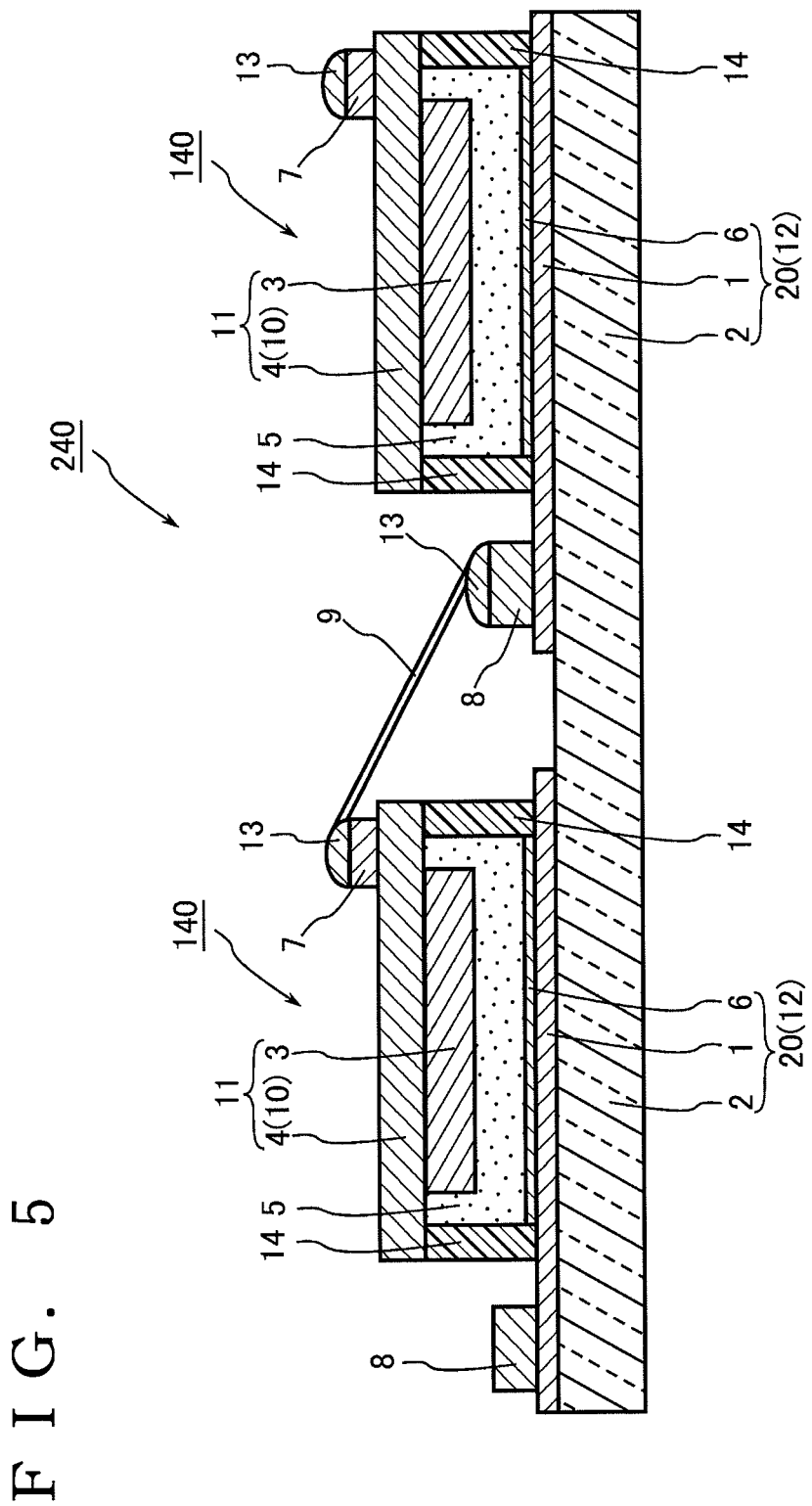
FIG. 5 is a sectional view illustrating a modified example of the photoelectric conversion element module shown in FIG. 1.

For example, the porous oxide semiconductor layer 3 is formed on the transparent conductor 1 of the second electrode in the first to fourth embodiments. In addition, the working electrode 11 includes the second electrode and the porous oxide semiconductor layer 3 on which the dye-sensitizing agent is supported, and the counter electrode 12 includes the first electrode. However, the present invention is not limited thereto. FIG. 5 is a sectional view illustrating a modified example of the photoelectric conversion element module 200 shown in FIG. 1. In a photoelectric conversion element 140 of a photoelectric conversion element module 240 shown in FIG. 5, the first electrode 10 may be formed of the metal plate 4 and the porous oxide semiconductor layer 3 may be formed on the first electrode 10. In this case, the catalyst layer 6 is formed on the transparent conductor 1, and the second electrode 20 includes the transparent base 2, the transparent conductor 1, and the catalyst layer 6. The working electrode 11 includes the first electrode 10 and the porous oxide semiconductor layer 3 on which the dye-sensitizing agent is supported, and the counter electrode 12 includes the second electrode. The catalyst layer 6 is made of, for example, platinum which is formed thinly so that light permeates.

The photoelectric conversion element module 240 can be obtained by preparing one pair of photoelectric conversion elements 140 and 140, connecting one end of the conductive wire 9 to the terminal 7 formed on the first electrode 10 on the working electrode 11 of one photoelectric conversion element 140, and connecting the other end of the conducive line 9 to the terminal 8 formed on the counter electrode 12 (second electrode 20) of the other photoelectric conversion element 140.

The photoelectric conversion element 140 is manufactured in the following way. First, the first electrode 10 including the metal plate 4 is prepared. Next, the porous oxide semiconductor layer 3 is formed on the catalyst layer 6 of the first electrode 10. The porous oxide semiconductor layer 3 may be formed on the first electrode 10 by the same process as the process of forming the porous oxide semiconductor layer 3 in the first embodiment. Next, the dye-sensitizing agent is supported on the porous oxide semiconductor layer 3. The dye-sensitizing agent may be supported by the process of incorporating the dye-sensitizing agent into the porous oxide semiconductor layer 3 according to the first embodiment. Thus, the working electrode 11 in which the porous oxide semiconductor layer 3 is formed on the first electrode 10 is obtained.

Next, the counter electrode 12 is prepared. The counter electrode 12 is prepared in such a manner that the transparent conductor 1 is formed on the transparent base 2, and then the catalyst layer 6 is formed on the transparent conductor 1 to form the second electrode. The transparent conductor 1 may be formed through the same method as the method of forming the transparent conductor 1 on the transparent base 2 in the first embodiment. The catalyst layer may be formed on the transparent conductor 1 through the same method as the method of forming the catalyst layer on the metal plate 4 in the first embodiment. The second electrode obtained in this way serves as the counter electrode 12.

Next, the porous oxide semiconductor layer 3 and the electrolyte 5 are sealed between the working electrode 11 and the counter electrode 12 by the sealing member 14. The porous oxide semiconductor layer and the electrolyte may be sealed by the same process as the sealing process according to the first embodiment. Next, the terminal 7 is formed. The terminal 7 may be formed by the same process as the terminal forming process in the first embodiment. The other processes are the same as those according to the first embodiment.

In this way, the photoelectric conversion element 140 is obtained.

In the manufacturing of the photoelectric conversion element 140, the terminal 7 is formed after the sealing process in the above description. However, the terminal 7 may be formed before the sealing process. By thus forming the terminal 7, the heat in the terminal forming process is not transferred to the electrolyte 5. Therefore, it is possible to prevent the deterioration of the electrolyte 5 due to the heat in the terminal forming process.

In the manufacturing of the photoelectric conversion element 140, the terminal 7 may be formed before the process of causing the dye-sensitizing agent to be supported on the porous oxide semiconductor layer 3. By thus forming the terminal 7, the heat in the terminal forming process is not transferred to the dye-sensitizing agent, so that it is possible to prevent deterioration of the dye-sensitizing agent due to the heat in the terminal forming process.

For example, the photoelectric conversion element module includes one pair of photoelectric conversion elements in the first to fourth embodiments. However, the photoelectric conversion element module according to the present invention may include three or more photoelectric conversion elements. In the photoelectric conversion element module including three or more photoelectric conversion elements, the conductive member may connect one side of the first electrode that is opposite to the second electrode in at least one photoelectric conversion element to one side of the second electrode that is facing the first electrode in at least one different photoelectric conversion element. The connection between the conductive member and each of the first and second electrodes may be performed in the same way as that of the first or second embodiment.

The second electrodes 20 is configured to share the transparent substrate 2, but the second electrode 20 may be separate ones. In this case, the second electrode includes the transparent base 2 and the transparent conductor 1 formed on the transparent base 2. However, the second electrode may be configured to include a conductive glass as the transparent conductor.

The insulating member 15 constitutes part of the sealing member 14 in the fifth embodiment. However, the insulating member 15 may be a separate member from the sealing member 14.

According to each of first to fourth embodiments, the connection between the conductive member and the second electrode is achieved by way of the terminal 8. However, the second terminal 8 is not necessarily required. The conductive member and the transparent conductor 1 may be directly connected to each other. According to this photoelectric conversion element module, since the terminal 8 is not formed, it is possible to simplify the structure of the photoelectric conversion element module and manufacture the photoelectric conversion element module at a low cost.

A platinum plate may be used instead of the metal plate 4 and the catalyst layer 6 in the first to fourth embodiments. In this case, it is not necessary to form the catalyst layer 6.

INDUSTRIAL APPLICABILITY

According to the present invention, there is provided a photoelectric conversion element module capable of enabling easy maintenance.

REFERENCE NUMERALS

1: transparent conductor
2: transparent base
3: porous oxide semiconductor layer
4: metal plate
5: electrolyte
6: catalyst layer
7: terminal
8: terminal
9: conductive wire
9a: conductive adhesive
10: first electrode
11: working electrode
12: counter electrode
14: sealing member
20: second electrode
35: collective wiring
100, 110, 120, 130, 140: photoelectric conversion element
200, 210, 220, 230, 240: photoelectric conversion element module

The invention claimed is:

1. A photoelectric conversion element module comprising:
a plurality of photoelectric conversion elements, each including a first electrode and a second electrode facing each other, an oxide semiconductor layer provided between the first electrode and the second electrode, and the second electrode having a transparent conductor; the first electrode including a metal plate made of titanium or a titanium alloy and a catalytic layer provided on the metal plate, the catalytic layer facing the second electrode, and
a conductive member electrically connecting the photoelectric conversion elements to each other,
wherein the plurality of photoelectric conversion elements have a transparent base shared by the plurality of photoelectric conversion elements,
wherein the first electrode and the second electrode are arranged such that the first electrode and the second electrode are separate from one another in a direction of thickness of the transparent base,
wherein one end of the conductive member is connected to a surface of the metal plate of the first electrode in at least one photoelectric conversion element, the surface facing in an opposite direction from the second electrode in the at least one photoelectric conversion element and the other end of the conductive member is connected to a terminal formed only on a surface of the second electrode in at least one different photoelectric conversion element which is facing the first electrode in the at least one different photoelectric conversion element, the terminal and the second electrode in at least one different photoelectric conversion element which is facing the first electrode in the at least one different photoelectric conversion element not overlapping the first electrode in the at least one different photoelectric conversion element, when the second electrode in the at least one different photoelectric conversion element is viewed in a direction perpendicular to the surface of the second electrode and the terminal being made of gold, silver, copper, platinum, or aluminum,
wherein the conductive member is disposed on the same side as the first electrode or the second electrode with respect to the transparent base,
wherein the conductive member and the second electrode are made of different materials;
wherein a surface of the second electrode which is facing the conductive member in the photoelectric conversion element having the first electrode connected to the conductive member is covered with an insulating member, an electrolyte is sealed between the first and second electrodes by a sealing member, a part of which is provided between the first electrode and the second electrode, and the insulating member is formed as part of the sealing member and is provided between the transparent conductors of the second electrodes of the adjacent photoelectric conversion elements,
wherein the one end of the conductive member overlaps the sealing member when the conductive member and the sealing member are viewed in a direction perpendicular to the surface of the second electrode that faces the first electrode in the at least one photoelectric conversion element, and
wherein only the electrolyte is provided in a space between the first electrode, the second electrode, the oxide semiconductor layer and the sealing member.

2. The photoelectric conversion element module according to claim 1, wherein the conductive member connects a terminal formed on the first electrode to the terminal formed on the second electrode.

3. The photoelectric conversion element module according to claim 1, wherein the conductive member is formed of a conductive wire.

4. The photoelectric conversion element module according to 1, wherein the conductive member is formed of a conductive adhesive.

5. The photoelectric conversion element module according to claim 1, wherein the conductive member is formed of solder with a melting point of 200° C. or more.

6. The photoelectric conversion element module according to claim 1, wherein a dye-sensitizing agent is supported on the oxide semiconductor layer, and the oxide semiconductor layer is a porous oxide semiconductor layer.

7. The photoelectric conversion element module according to claim 1, wherein the transparent conductor of each of the plurality of photoelectric conversion elements includes upper, lower, and side surfaces, and the insulating member contacts one of the side surfaces of the transparent conductor.

* * * * *